United States Patent [19]

Uroshevich

[11] 4,383,130

[45] May 10, 1983

[54] SOLAR ENERGY CELL AND METHOD OF MANUFACTURE

[75] Inventor: Miroslav Uroshevich, Cincinnati, Ohio

[73] Assignee: Alpha Solarco Inc., Cincinnati, Ohio

[21] Appl. No.: 260,369

[22] Filed: May 4, 1981

[51] Int. Cl.³ .................... H01L 31/06; H01L 31/18
[52] U.S. Cl. .................................. 136/261; 29/572;
  136/256; 148/1.5; 427/74; 427/86; 156/622;
  156/624; 156/DIG. 88; 204/192 C; 204/192 S;
  357/30
[58] Field of Search ...................... 29/572; 148/1.5;
  427/74, 75, 86; 156/622, 624, DIG. 88; 136/258
  PC, 261, 256; 357/30; 204/192 C, 192 S

[56] References Cited

U.S. PATENT DOCUMENTS

| | | | |
|---|---|---|---|
| 3,914,856 | 10/1975 | Fang | 29/572 |
| 4,058,418 | 11/1977 | Lindmayer | 148/175 |
| 4,087,571 | 5/1978 | Kamins et al. | 427/86 |
| 4,112,135 | 9/1978 | Heaps et al. | 427/11 |
| 4,113,532 | 9/1978 | Authier et al. | 148/174 |
| 4,152,535 | 5/1979 | Deminet et al. | 136/258 PC |
| 4,229,231 | 10/1980 | Witt et al. | 148/1.5 |
| 4,252,861 | 2/1981 | Heaps | 428/446 |
| 4,309,239 | 1/1982 | Fumeton | 156/601 |
| 4,313,254 | 2/1982 | Feldman et al. | 29/572 |
| 4,318,938 | 3/1982 | Barnett et al. | 427/75 |
| 4,323,419 | 4/1982 | Wakefield | 156/622 |

FOREIGN PATENT DOCUMENTS

2939348 4/1980 Fed. Rep. of Germany ...... 136/258 PC
2386359 12/1978 France ........................ 136/258 PC

OTHER PUBLICATIONS

"Inexpensive Silicon Sheets for Solar Cells", *NASA Technical Briefs,* Winter 1977, pp. 432-433.
J. D. Zook et al., "Growth, Evaluation, & Modeling of Silicon-On-Ceramic Solar Cells", *Conf. Record, 13th IEEE Photovoltaic Specialists Conf., (1978), pp. 472-478.*

*Primary Examiner*—Aaron Weisstuch
*Attorney, Agent, or Firm*—Gary M. Gron

[57] ABSTRACT

The disclosure illustrates a ribbon like photovoltaic cell that is formed by first applying a thin layer of tungsten or other conductive, temperature resistant material on a base ribbon of high temperature resistant, and electrically non-conductive material. A thin coat of silicon up to several atoms thick is deposited over the ribbon and/or tungsten to enable the ribbon to be drawn through a bath of molten silicon to grow a layer of silicon which is subsequently doped with impurities. A conductive grid over the silicon and a connector through a perforation in the base ribbon enable the cell to be connected in an electrical circuit to produce a current flow. The use of the base ribbon enables continuous flow process techniques to greatly reduce the cost of production for a photovoltaic cell. In addition, the base ribbon may be split lengthwise after processing on both sides to enable the production of two (2) ribbons.

25 Claims, 5 Drawing Figures

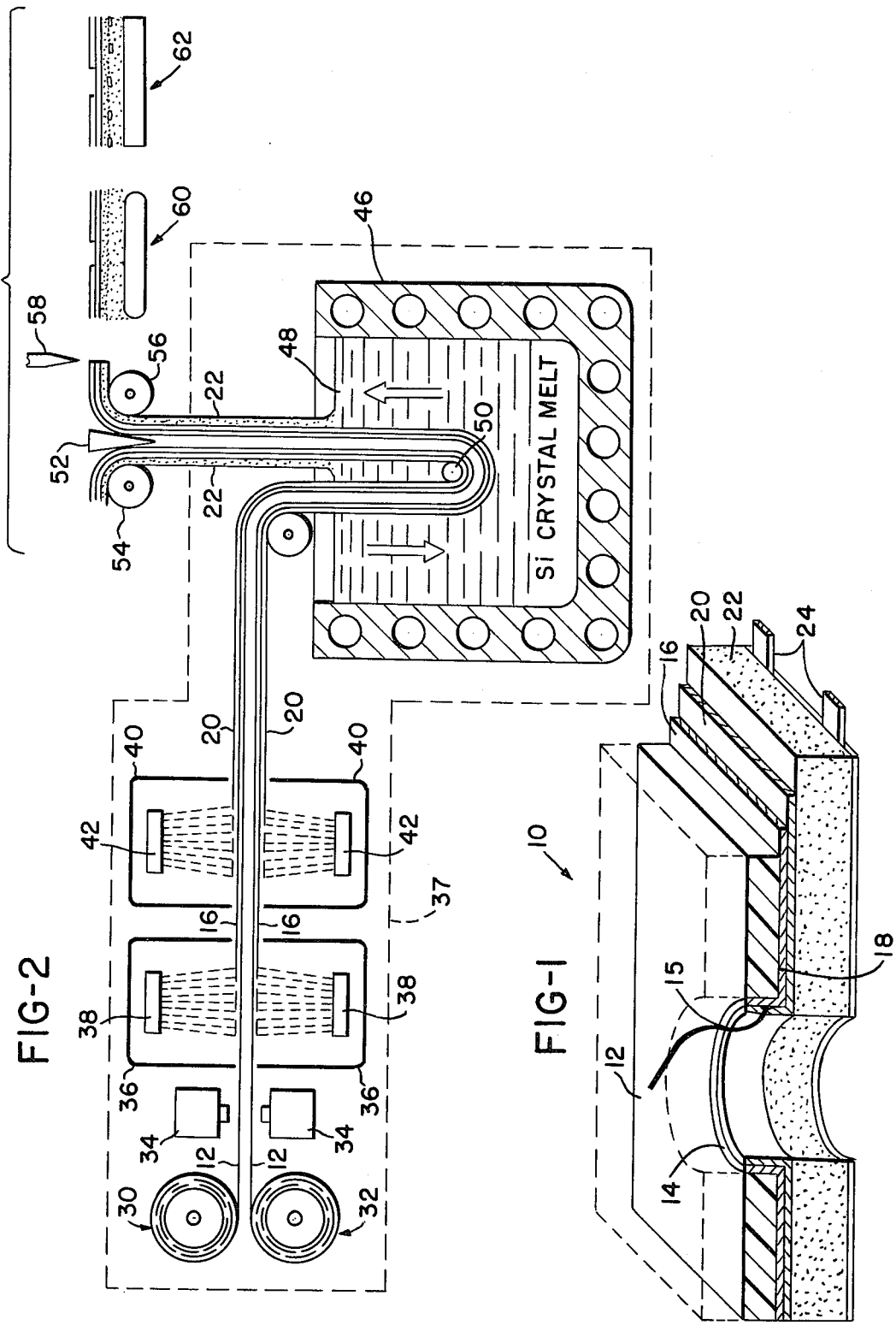

SOLAR ENERGY CELL AND METHOD OF MANUFACTURE

The present invention relates to silicon solar energy cells and more specifically to manufacture of such cells in ribbon like form.

Ever since the first photovoltaic cells were demonstrated by Bell Laboratories in the 50's there have been continuing efforts to reduce manufacturing costs by departing from the Czochralski process of laboriously growing a boule of single crystal silicon and then wasting most of it by slicing it into thin wafers.

Many proposals have been disclosed for ribbon manufacture of silicon, such as U.S. Pat. Nos. 3,868,228; 3,870,477; 4,184,907; 4,185,076 and 4,239,583 which deal with growing a silicon ribbon through a die. U.S. Pat. No. 4,058,418 discloses providing a liquid coating on a carrier and then depositing a silicon seed crystal on the coating so that silicon can be deposited on the carrier.

Although the above patents disclose alternate solutions to the "Czochralski dilemma" they do not address low cost methods to make a complete functioning solar energy cell.

The above problems are solved by a solar energy cell made by first applying a layer of electrically conductive heat resistant material to a thin base ribbon of high temperature resistant electrically non-conductive material. A coat of silicon up to several atoms thick is applied to selected areas covering at least the portion covered by the electrically conductive material. The selected areas are then passed through a molten bath of silicon to grow a layer of silicon.

The above and other related features of the present invention will be apparent from a reading of the following description of the disclosure shown in the accompanying drawings and the novelty thereof pointed out in the appended claims.

In the drawings:

FIG. 1 is a partially cut away perspective view of a solar energy cell embodying the present invention.

FIG. 2 is a schematic view of the process used in the manufacture of the solar energy cell of FIG. 1.

Figure 4:
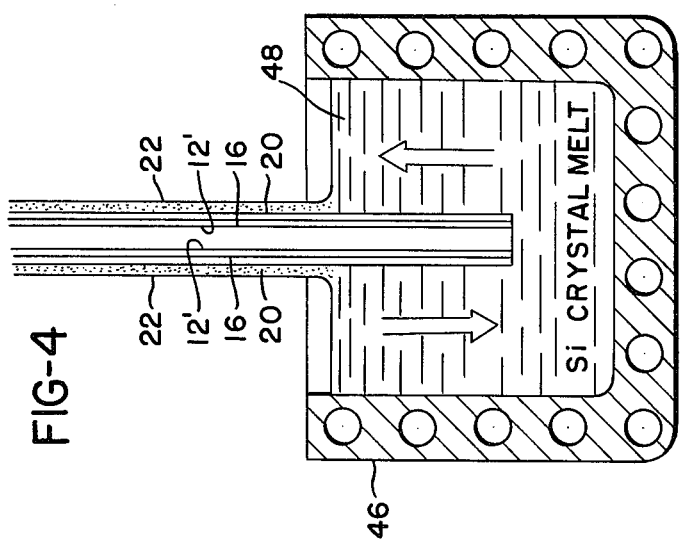
FIGS. 3 and 4 are schematic views of a process illustrating an alternate embodiment of the present invention.

FIG. 1 shows a ribbon like solar energy cell 10 comprising a base ribbon 12 of electrically non-conductive, high temperature resistant and preferably flexible material. A thin layer of high temperature resistant, electrically conductive material 16 is applied to one face 18 of the base ribbon 12. Base ribbon 12 has a perforation 14 which enables an electrical connection 15 from the electrically conductive material 16 to the back face of the cell. A very thin coat (up to several atoms thick) of silicon, preferably in single crystal form, is deposited over the electrically conductive material 16. A layer of silicon 22, also preferably in single crystal form, is grown over the very thin layer of silicon 20 as described later in this discussion. In addition, selected impurities are applied to the silicon 22 which enable electrons to flow in the presence of solar radiation. An electrically conductive grid 24 is applied over the face of the silicon 22 that faces solar radiation to cause a current flow when the grid 24 and electrical connection 15 are connected to a load (not shown).

The process for manufacturing the solar energy cell 10 will be described below.

First, it is necessary to identify preferred materials for the various components.

TABLE I

| ITEM | MATERIAL | THICKNESS | MELTING POINT |
|---|---|---|---|
| Base ribbon 12 | Macor[1] | .01mm or less | 1832° F. |
| | Pyroceram[2] | .01mm or less | 1832° F. |
| | Carbon Fiber | .01mm or less | 5700° F. |
| Electrically Conductive Material 16 | Molybdenum | .01mm or less | 4730° F. |
| | Tantalum | .01mm or less | 5425° F. |
| | Titanium | .01mm or less | 3074° F. |
| | Tungsten | .01mm or less | 6200° F. |
| Silicon Coat 20 | Silicon | Up to 6 atoms thick | 2588° F. |
| Grown Silicon 22 | Silicon | 100–600 micrometers | 2588° F. |

[1]Macor is a trademark for a machinable glass ceramic available from Corning Glass Works, Macor Machine & Glass Ceramic Dept. - MP-52-1, Corning, New York
[2]Pyroceram is a trademark for a ceramic cloth available from Corning Glass, 80 Houghton Park, Corning, New York.

FIG. 2 shows a continuous process for manufacturing the photovoltaic cell of FIG. 1. It should be understood, however, that the cell may be also manufactured using traditional silicon growing techniques while still retaining the features of the present invention.

As illustrated, base ribbons 12 are provided in continuous rolls 30,32 which unwind to abut adjacent ribbons 12 and form a base ribbon 12 of two layers (the ribbons are spaced from one another in the figure to facilitate identification of the various components). Alternately, a single unitary base ribbon may be used in which case it is sliced to half thickness later in the process.

The ribbon 12 is fed first to a punch press or other machine 34 which perforates the ribbon 12 at spaced locations corresponding to individual cells 10. From there the ribbon 12 is fed to a first vacuum chamber 36 where electrodes 38 containing the electrically conductive material 16 are maintained at a high level voltage differential relative to the base ribbon 12. This causes atoms of the electrically conductive material 16 to be sputtered on to the base ribbon 12 in accordance with the process more fully described in Sputtercoating by Varian A.I.C.O., Palo Alto Vacuum Division VAC 2468A, printed in U.S.A. 6/79, Section 14, to apply an accurately controlled layer from mono-atomic up to several hundred microns thick, thus resulting in a composite ribbon. The materials identified in Table I preferably are utilized because of their ability to conduct electricity and their ability to resist temperatures above the melting point of silicon. The electrically conductive material covers the outer facing surface 18 of the ribbon if masking is used, and additionally the side edges in the absence of a mask.

The composite ribbon is fed to a second vacuum chamber 40. In chamber 40 electrodes 42 containing silicon are maintained at a high voltage differential relative to the composite ribbon. This causes atoms of silicon to be sputtered on to the composite ribbon in a precisely controlled fashion to form the silicon coat 20 completely over the portion of the ribbon that will be passed through molten silicon to prevent contamination. Preferably, the coat is one atom thick but can be up to 6 atoms thick. As illustrated, the coat of silicon covers the outer facing surfaces of the composite ribbon and the side edges to completely cover it.

From there the coated composite ribbon passes over a roller 44 and extends into a crucible 46 of molten silicon 48 containing a predetermined amount of an impurity such as boron. Another roller 50 causes the ribbon to reverse direction and extend out of the molten silicon 48. The silicon coat 20 prevents impurities from contaminating the molten silicon 48 and acts as a seed crystal to cause a layer of single crystal silicon to be grown around the coated composite ribbon. The thickness of the coat is controlled by varying the temperature of the molten silicon 48 and the speed with which the ribbon is pulled from the crucible.

After leaving the crucible 46 the ribbon is sliced in half lengthwise by a cutting knife 52. When the base ribbon is provided from two rolls, the knife only cuts through the conductive material and silicon on the edges of the ribbon. If the base ribbon 12 is provided from a single roll, the knife slices through the base ribbon lengthwise to produce two base ribbons having a thickness of one half of the original base ribbon (see dashed lines in FIG. 1).

In either case, the separated ribbons pass over separate rollers 54,56 to form identical ribbons. To simplify the discussion, further processing of only one of the ribbons will be described, but it should be understood that the steps will be applicable to the other ribbon.

A cutoff knife 58 slices the ribbon crosswise into individual cells 10. As illustrated, the perforation 14 is positioned approximately in the middle of the cell 10 to enable the electrical connection 15 to the conductive material 16 to be made through the base ribbon at station 60.

The silicon layer 22 of the cell 10 is doped with an impurity such as arsenic to provide a junction in the silicon which separates electrical charges. At station 62, an electrically conductive grid 24 is then plated on or otherwise attached to the surface of the silicon layer 22 that will be exposed to sunlight. As is usual practice, the grid exposes a substantial portion of the surface area of the silicon layer 22 to sunlight while enabling an electrical connection to cause a current flow when the grid 24 and electrical connection 15 are connected to a load.

The process described above utilizes a base ribbon, composite ribbon and coated composite ribbons that are flexible. Depending upon the degree of flexibility the bends through which the various ribbons pass can be less than illustrated in FIG. 2. If desired, the depositing and growing functions as shown in FIG. 2 may be performed in a single vacuum chamber 37 which has the additional benefit of reducing heat losses from crucible 46.

Figure 3:
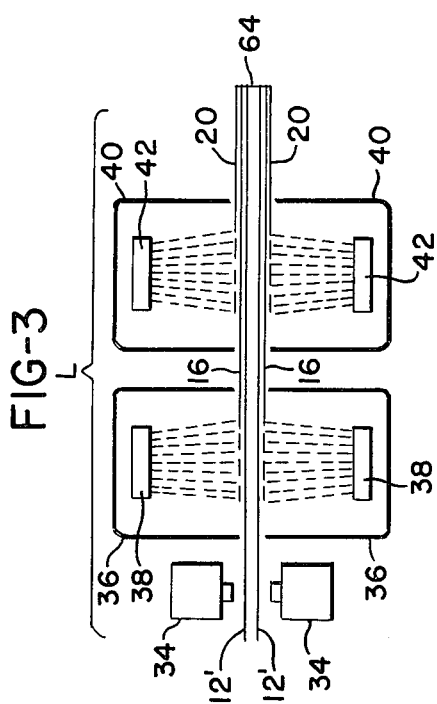

It if it desired not to place a bend in any of the ribbons, the process of FIGS. 3 and 4 may be employed. In this embodiment the base ribbon (or ribbons) 12' is (are) provided in discrete lengths L that are used to generate a multiplicity of solar energy cells 10. A layer of conductive material 14 and silicon are applied as in the process of FIG. 2 using the vacuum chambers 36 and 40. It should be noted that a single vacuum chamber may be employed as was suggested in the description of FIG. 2.

Afterwards, the composite ribbon 12' is fully coated with silicon up to several atomic layers thick, even on its end 64. At this point the coated composite ribbon 12' is dipped into the crucible 46 of molten silicon 48 to begin the process of growing the layer of silicon 22 as the ribbon 12' is withdrawn. The parameters of the withdrawal are controlled to build up the desired thickness of single crystal silicon.

When the ribbon 12 is fully withdrawn it is sliced in half lengthwise to result in ribbons having half the thickness of the original ribbon. Further processing is carried out according to the steps described in FIG. 2.

Figure 5:
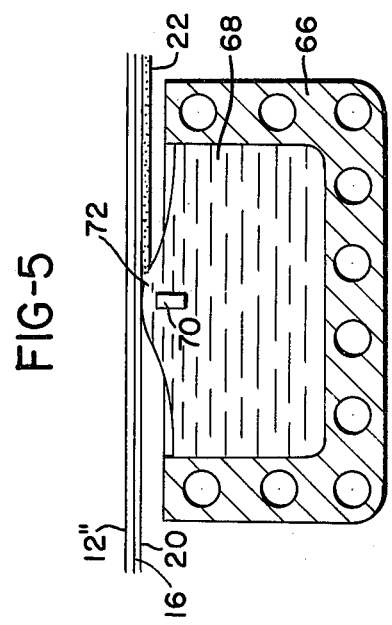
FIG. 5 is a schematic view of yet another process embodying the present invention.

FIG. 5 illustrates still another embodiment of the present invention wherein a single continuous base ribbon 12" has the electrically conductive material 16 applied to one face and the edges. Subsequently, the coat of silicon 20 is deposited over the area covered by the electrically conductive material 14. The composite and coated ribbon 12" is then passed through a crucible 66 of molten silicon 68 which is circulated over a baffle 70 to form a wave 72 which comes in contact with the surfaces covered by the silicon coat 20. As the ribbon 12" is moved relative to the wave 72 of molten silicon 68, the layer of silicon 22 grows over the silicon coat 20 to a thickness controlled by various parameters including the motion of the ribbon 12" relative to the wave 72. Once the layer of silicon 22 is applied, the ribbon 12" is processed as described before.

It should be noted there are several important features of all of the above processes which contribute to a solar energy cell that is manufactured at costs that are substantially reduced compared to existing production methods.

The first feature is the provision of the base ribbon which supports all the coated elements throughout the process. In addition it permits growing of only the precise amount of silicon necessary to establish the silicon layer instead of prior processes in which a majority of the carefully grown silicon is sawed away.

The second feature is that of coating the ribbon with a very thin coat of silicon to prevent contamination of the molten silicon from which the single crystal layer is grown.

A third feature is the provision of perforations in the base ribbon which enable a connection to the electrically conductive material from the back face of the ribbon.

While several embodiments of the present invention have been described it should be apparent to those skilled in the art that other forms may be employed without departing from its spirit and scope.

Having thus described the invention, what is claimed as novel and desired to be secured by Letters Patent of the United States is:

1. A method of forming a ribbon shaped silicon body comprising the steps of:
   providing a base ribbon of relatively thin, high temperature resistant, electrically non conductive material; applying a layer of electrically conductive high temperature resistant material on both faces of said base ribbon and the edges thereof to form a composite ribbon;
   depositing a coat of silicon over selected surface areas of the composite ribbon, said selected areas extending at least as far as the limits of the layer of said electrically conductive material, said silicon coat being up to approximately several atomic layers thick; passing said selected areas of said composite ribbon through a molten bath of silicon for growing a layer of silicon over said silicon coat to form a resultant ribbon; and
   slicing said resultant ribbon lengthwise through said base ribbon to define two (2) ribbons having approximately half the thickness of said resultant ribbon, one (1) face of each ribbon being defined by the layer of silicon.

2. A method of forming a ribbon shaped silicon body comprising the steps of:
   providing a base ribbon of relatively thin, high temperature resistant, electrically nonconductive material;
   applying a layer of electrically conductive high temperature resistant material on at least one (1) face of said base ribbon to form a composite ribbon;
   providing a coat of silicon over selected surface areas of said composite ribbon, said selected areas extending at least as far as the limits of the layer of said electrically conductive material, said silicon coat being deposited to a precisely controlled thickness of up to several atoms thick; and passing said selected areas of said composite ribbon through a molten bath of silicon for growing a layer of single crystal silicon over said silicon coat to form a resultant ribbon.

3. A method as in claim 1 wherein said base ribbon is flexible.

4. A method as in claim 3 wherein said base ribbon is provided in an elongated roll and the steps of applying said electrically conductive material, depositing the coat of silicon and growing the layer of silicon are performed in sequence thereby permitting a continuous process.

5. A method as in claim 4 wherein the electrically conductive material and the coat of silicon are sputtered and wherein the entire process is done in a vacuum.

6. A method as in claim 1 wherein said base ribbon is formed from a carbon fiber cloth.

7. A method as in claim 1 wherein said base ribbon is formed from a ceramic cloth.

8. A method as in claim 1 wherein said electrically conductive material is sputtered on to said base ribbon to from said composite ribbon.

9. A method as in claim 1 wherein said electrically conductive material has a melting point greater than that of silicon.

10. A method as in claim 1 wherein said electrically conductive material is a metal selected from the group comprising titanium, tungsten, tantalum, and molybdenum.

11. A method as in claim 1 or 2 wherein said base ribbon is no more than 0.01 mm thick.

12. A method as in claim 1 or 2 wherein said silicon coat is from 1 to 6 atoms thick.

13. A method as in claim 1 or 2 wherein layer of silicon is grown to a thickness from 100 to 600 microns.

14. A method as in claim 1 or 2 wherein said silicon coat is sputtered on said composite ribbon.

15. A method as in claim 1 wherein the resultant ribbon is sliced crosswise to provide smaller lengths.

16. A method as in claim 15 wherein the resultant ribbon is sliced crosswise after it is sliced lengthwise.

17. A method as in claim 1 or 2 wherein said silicon is in a single crystal form and wherein the method further comprises the steps of:
   doping said single crystal silicon with an impurity that enables electrons to flow through said silicon in the presence of solar radiation;
   placing an electrically conductive grid over the doped single crystal silicon, and
   making an electrical connection to the layer of electrically conductive material thereby enabling a current flow across the doped single crystal silicon in the presence of solar radiation.

18. A method as in claim 13 wherein the electrical connection is made by perforating the base ribbon to expose the electrically conductive layer.

19. A method as in claim 18 wherein the base ribbon is perforated before the electrically conductive layer is placed over it.

20. A photovoltaic cell comprising:
   a base ribbon of relatively thin, high temperature resistant, electrically nonconductive material; a layer of electrically conductive high temperature resistant material on one (1) face of said base ribbon;
   a thin layer of silicon up to several atoms thick deposited over at least said electrically conductive material, said electrically conductive material being layered between said deposited layer of silicon and said base ribbon;
   a layer of single crystal silicon grown over said layer of silicon, said single crystal silicon having a controlled impurity in it which enables electrons to flow in the presence of solar radiation;
   means for making an electrical connection from said electrically conductive material to the face of said base ribbon opposite the face over which said electrically conductive material is layered; and a grid of electrically conductive material overlying said single crystal silicon but permitting solar radiation to strike a substantial portion thereof thereby causing a flow of electrons which produces a current flow between the grid and the electrical connection means.

21. A cell as in claim 20 wherein said electrical connection means comprises a perforation in said base ribbon exposing said electrically conductive layer and a conductor connected thereto and extending through said perforation.

22. A cell as in claim 21 wherein said base ribbon comprises a ceramic cloth.

23. A cell as in claim 21 wherein said base ribbon comprises a carbon fiber cloth.

24. A cell as in claim 21 wherein said electrically conductive material is selected from the group consisting of tungsten, titanium, molybdenum and tantalum.

25. A cell as in claim 21 wherein:
   said base ribbon is not greater than 0.01 mm thick and said single crystal silicon is from 100 to 600 microns thick.

* * * * *